United States Patent
Ueshima et al.

(10) Patent No.: US 10,968,932 B2
(45) Date of Patent: Apr. 6, 2021

(54) SOLDERED JOINT AND METHOD FOR FORMING SOLDERED JOINT

(71) Applicant: SENJU METAL INDUSTRY CO., LTD., Tokyo (JP)

(72) Inventors: Minoru Ueshima, Tokyo (JP); Yoshie Tachibana, Tokyo (JP)

(73) Assignee: SENJU METAL INDUSTRY CO., LTD., Tokyo (JP)

( * ) Notice: Subject to any disclaimer, the term of this patent is extended or adjusted under 35 U.S.C. 154(b) by 0 days.

(21) Appl. No.: 16/759,625

(22) PCT Filed: Oct. 30, 2018

(86) PCT No.: PCT/JP2018/040250
§ 371 (c)(1),
(2) Date: Apr. 27, 2020

(87) PCT Pub. No.: WO2019/088068
PCT Pub. Date: May 9, 2019

(65) Prior Publication Data
US 2020/0284282 A1    Sep. 10, 2020

(30) Foreign Application Priority Data
Oct. 31, 2017  (JP) .............................. JP2017-211000

(51) Int. Cl.
*F16B 5/08*     (2006.01)
*B23K 1/00*     (2006.01)

(52) U.S. Cl.
CPC .............. *F16B 5/08* (2013.01); *B23K 1/0008* (2013.01)

(58) Field of Classification Search
CPC ........ B23K 1/00; B23K 1/008; B23K 1/0008; B23K 35/26; F16B 5/08; Y10T 403/477–479
See application file for complete search history.

(56) References Cited

U.S. PATENT DOCUMENTS 10,157,877 B2    12/2018    Kido et al.
2005/0156324 A1   7/2005    Nakase et al.
(Continued)

FOREIGN PATENT DOCUMENTS

CN    101380701 A    3/2009
CN    105609434 A    5/2016
(Continued)

OTHER PUBLICATIONS

International Search Report dated Dec. 11, 2018 for the corresponding PCT Patent Application No. PCT/JP2018/040250.
(Continued)

*Primary Examiner* — Daniel J Wiley
(74) *Attorney, Agent, or Firm* — Leason Ellis LLP

(57) ABSTRACT

A solder joint in which an electronic component with a back metal is bonded to a substrate by a solder alloy. The solder alloy includes: a solder alloy layer having an alloy composition consisting of, in mass %: Ag: 2 to 4%, Cu: 0.6 to 2%, Sb: 9.0 to 12%, Ni: 0.005 to 1%, optionally Co: 0.2% or less and Fe: 0.1% or less, with the balance being Sn; an Sn—Sb intermetallic compound phase; a back metal-side intermetallic compound layer formed at an interface between the back metal and the solder alloy; and a substrate-side intermetallic compound layer formed at an interface between the substrate and the solder alloy. The solder alloy layer exists at least one of between the Sn—Sb intermetallic compound phase and the back metal-side intermetallic compound layer, and between the Sn—Sb intermetallic compound phase and the substrate-side intermetallic compound layer.

13 Claims, 4 Drawing Sheets

(56) References Cited

U.S. PATENT DOCUMENTS

| | | |
|---|---|---|
| 2006/0049521 A1 | 3/2006 | Kayukawa et al. |
| 2007/0176293 A1 | 8/2007 | Kayukawa et al. |
| 2011/0198755 A1 | 8/2011 | Maeda et al. |
| 2013/0302646 A1 | 11/2013 | Chen et al. |
| 2015/0262959 A1 | 9/2015 | Hisazato et al. |
| 2016/0056570 A1 | 2/2016 | Yoshikawa et al. |
| 2017/0014955 A1 | 1/2017 | Ueshima et al. |
| 2018/0264601 A1* | 9/2018 | Ueshima ................. H01L 24/81 |

FOREIGN PATENT DOCUMENTS

| | | |
|---|---|---|
| EP | 1350588 A2 | 10/2003 |
| EP | 3127652 A1 | 2/2017 |
| JP | 06-244226 A | 9/1994 |
| JP | 2001-144111 A | 5/2001 |
| JP | 2001-196393 A | 7/2001 |
| JP | 2006-108604 A | 4/2006 |
| JP | 2007-053268 A | 3/2007 |
| JP | 2010-000513 A | 1/2010 |
| JP | 2013-004894 A | 1/2013 |
| JP | 2015-070052 A | 4/2015 |
| JP | 2015-173215 A | 10/2015 |
| WO | WO-2010/047139 A1 | 4/2010 |
| WO | WO-2015/152387 A1 | 10/2015 |

OTHER PUBLICATIONS

Written Opinion of the International Searching Authority dated Dec. 11, 2018 for the corresponding PCT Patent Application No. PCT/JP2018/040250.

International Preliminary Report on Patentability dated Jul. 26, 2019 for the corresponding PCT Patent Application No. PCT/JP2018/040250.

Japanese Office Action dated Nov. 19, 2019 for the corresponding Japanese Patent Application No. 2019-543393.

Chinese Office Action dated Sep. 2, 2020 for the corresponding Chinese Patent Application No. 201880070809.8.

Partial Supplementary European Search Report dated Nov. 5, 2020 for the corresponding European Patent Application No. 18873077.4.

P. H. Tsao et al. "Cu Bump Flip Chip Package Reliability on 28nm Technology", *2016 IEEE 66th Electronic Components and Technology Conference*, May 31-Jun. 3, 2016, May 31, 2016, pp. 1148-1153, Las Vegas, NV, USA.

Extended European Search Report dated Feb. 10, 2021 for the corresponding European Patent Application No. 18873077.4.

"Reflow soldering", *Wikipedia*, Aug. 17, 2017, XP-055770130, URL:https://en.wikipedia.org/w/index.php?title=Reflow soldering &oldid=796001705.

Suraski D, "Reflow Profiling: Time Above Liquidus", Mar. 25, 2017, XP-055770145, URL:http://web.archive.org/web/20170325052017/https://aimsolder.com/technical-articles/reflow-profiling-time-above-liquidus.

\* cited by examiner

SOLDERED JOINT AND METHOD FOR FORMING SOLDERED JOINT

CROSS-REFERENCE TO RELATED PATENT APPLICATIONS

This application is a U.S. National Phase Application under 35 U.S.C. § 371 of International Patent Application No. PCT/JP2018/040250, filed Oct. 30, 2018, and claims the benefit of priority to Japanese Patent Application No. 2017-211000, filed on Oct. 31, 2017, all of which are incorporated herein by reference in their entirety. The International Application was published in Japanese on May 9, 2019 as International Publication No. WO/2019/088068 under PCT Article 21(2).

FIELD OF THE INVENTION

The present invention relates to a solder joint in which separation of a back metal of an electronic component is prevented, and a method for forming a solder joint.

BACKGROUND OF THE INVENTION

In recent years, high integration, large capacity and high-speed processing are required for an electronic device. In order to satisfy this requirement, it is attempted to achieve high integration and high functionalization at a semiconductor chip level by using a semiconductor package such as QFP (Quad Flat Package). In the production of QFP, a packaging process of die-bonding a silicon chip cut out from a silicon wafer to a lead frame is employed.

In QFP, a solder joint is formed by die-bonding a silicon chip and a lead frame using a solder alloy through the packaging process. On the silicon chip, a back metal such as Ni layer is formed so as to improve wettability with the solder to enhance the adhesion strength. However, since Ni diffuses into Si due to heat during melting of the solder and the function of a semiconductor chip deteriorates, a barrier layer such as Ti layer is formed between the silicon chip and the Ni layer. In a case where the back metal layer is thus multilayered, separation between back metal layers or separation between back metal and solder alloy occurs in some cases. In order to prevent such separation, various studies have been made on the back metal layer.

JP-A-2001-196393 discloses a technique that for obtaining good bonding properties by preventing generation of voids and improving the wettability of a solder alloy, a first metal film composed of a layer containing Cr or V and a Ni layer and a second metal film (metal layer) containing Sn or Sb are provided above a silicon chip and an alloy containing Sn as a main component and containing 10 wt % or more of Sb is used as the solder alloy for bonding the silicon chip to a substrate.

JP-A-H06-244226 has proposed a semiconductor device having a bonding structure in which for preventing interfacial fracture due to production of an intermetallic compound, a metal layer (barrier layer) such as Cr or Ti is provided on a silicon chip and the barrier layer is directly adhered and fixed to a brazing material containing Sn and Sb as main components. In addition, according to JP-A-H06-244226, even when an intermediate layer such as Ni layer or Ag layer is provided between the barrier layer and the solder alloy so as to enhance the adhesion strength to the solder alloy, the intermediate phase disappears and an intermetallic compound phase with Sn is not generated, as a result, generation and selective fracture of an intermetallic compound phase are not caused.

In this way, in the conventional die bonding, various studies on the back metal are made by using an Sn—Sb-based solder alloy. An Sn—Sb alloy is employed in these studies so as to prevent a solder alloy used in the die bonding from melting during mounting on a printed circuit board, etc. since this alloy has a high liquidus temperature. However, even when the liquidus temperature of the solder alloy is increased by the addition of a large amount of Sb, since the heating temperature during mounting of a silicon chip on a printed circuit board reaches a temperature region near the liquidus temperature of the solder alloy, the solder alloy may be softened to cause a change in the resistance value of the solder joint.

Therefore, for example, JP-A-2001-144111 discloses a technique of using, in the bonding of an electrode portion after die bonding, a solder alloy formed of Sn containing from 0.005 to 5.0 mass % of at least one of Fe and Ni, further containing at least one of Ag: from 0.1 to 20 mass % and Cu: from 0.005 to 9 mass %, and also containing from 0.1 to 15 mass % of Sb, so as to improve the thermal fatigue resistance performance to reduce a change in resistance during heating.

Technical Problem

However, even when an Sn—Sb-based solder alloy having a high liquidus temperature is used as described in JP-A-2001-196393 and JP-A-H06-244226, when a Ni layer is stacked on the barrier layer, Ni sometimes diffuses into the solder alloy during melting of the solder alloy and disappears. In this case, the barrier layer comes into contact with the solder alloy and since the solder alloy hardly wets to the barrier layer, separation occurs at the interface between the barrier layer and the solder alloy. This is a possible problem in the die bonding. On the other hand, the invention described in JP-A-2001- aims at reducing the change in resistance during heating in the electrode bonding after die bonding. Accordingly, the inventions described in JP-A-2001-196393 and JP-A-H06-244226 firstly differ in the timing of the emergence of the problem from the invention described in JP-A-2001-144111 and therefore, occurrence of the above-described separation in die bonding cannot be avoided.

Furthermore, in the inventions described in JP-A-2001-196393 and JP-A-H06-244226, the back metal of the silicon chip is formed to be a multilayer structure so as to improve the wettability of the back metal with the solder alloy and prevent the generation of an intermetallic compound phase having an adverse effect. However, since respective layers differ in the linear expansion coefficient, when the solder layer is melted and solidified, a stress may be generated between layers to cause separation at the interface. In a case where the planar dimension of the separation area is small, the stress is concentrated on the separation area, and a crack may start from the separation area and propagate to the silicon chip and as a result, the silicon chip may be broken. Above all, in JP-A-H06-244226, it is stated that the Ni layer of 0.6 μm disappears in die bonding, and in this case, separation may occur at the interface between the barrier layer and the solder alloy. This is because when Ni disappears as described in JP-A-H06-244226, the solder alloy is bonded to Ti but Ti repels the solder alloy because of very poor wettability of the solder alloy to Ti. The reason for poor wetting of Ti is as follows. As for the manufacturing conditions of an Sn—Ti alloy, the heating temperature is 1,200° C. or more and heating for several hours in an inert gas atmosphere is necessary. Therefore, it is difficult to completely wet Sn and Ti with each other at a heating temperature of 400° C. or less, which is a normal soldering condition, by short-time heating for 30 minutes or less.

Furthermore, even if Ni layer partially remains, Ti is exposed. In this case, the solder alloy hardly wets with Ti, which is considered to increase voids.

Here, in the case where disappearance of the Ni layer described in JP-A-H06-244226 occurs in an ideal environment absolutely free from a gas or atom except for Ni, Ti and Sn, good wetting of Ti and Sn may be brought out after Ni is completely melted. However, in an realistic environment, some kind of oxide is formed at the interface between Ni and Ti, and even in a vacuum atmosphere, a large amount of oxygen atom is contained. Furthermore, a void is necessarily formed during melting and soldering in the soldering step, and the void contains oxygen atom or other organic components, which will become a contaminant. Oxygen acts as a contaminant gas for Ti. As the Ni layer disappears, the contaminant gas comes into contact with Ti to deteriorate the surface and worsen the wettability with the solder alloy and in turn, separation is readily caused.

Typically, the liquidus temperature or solidus temperature of the solder alloy changes depending on the composition. Therefore, depending on the conditions in soldering, there may occur non-wetting of solder alloy, splashing of molten solder, and chip cracking.

In addition, electronics are used in an inferior environment as the application of the electronics is diversified. Even in a case where separation does not occur in solidification of the solder alloy, in an environment having drastic temperature changes, separation occurs due to repeated strains caused by stress. In a case where the non-wetting area or separation area is local, as described above, a crack may start from the separation area to generate a crack in the silicon chip. In a case where the void expands significantly or the planar dimensions of non-wetting area and separation area are large, the heat dissipation property at the interface between the silicon chip and the solder alloy is extremely reduced, which may cause a serious problem such as firing from a semiconductor device.

As described above, the inferior use environment due to achievement of high integration, large capacity and high-speed processing of an electronic device or spreading of the application range imposes a heavy load on an electronic component. Further studies are necessary for preventing generation of cracks caused by separation of a silicon chip or exhibiting high heat dissipation property. Specifically, studies for preventing disappearance of the Ni layer that is a part of the back metal are needed.

An object of the present invention is to provide a solder joint exhibiting excellent reliability by preventing separation of a back metal from a solder alloy during formation of a solder joint and preventing non-wetting of solder alloy, splashing of molten solder, and a breakage of an electronic component due to chip cracking, and a method for forming the solder joint.

SUMMARY OF THE INVENTION

Solution to Problem

The present inventors first examined the cause of separation of a back metal and a solder alloy, in addition to the diffusion of Ni and the stress during solidification. Conventionally, the cause of separation has been examined by focusing an attention on a back metal layer as described above, but the problem has not yet been solved. On the other hand, the present inventors have paid attention to the fact that the separation is attributable not to the back metal layer but to the structure of the solder alloy. Furthermore, since melting or softening of a solder alloy in the die bonding must be avoided, the present inventors thought that it is necessary to use, among Sn—Sb-based solder alloys, particularly a solder alloy containing Sn, Ag, Cu, Sb and Ni together.

Then, the present inventors have focused on a solder joint using an Sn—Ag—Cu—Sb—Ni solder alloy and examined a separated sample in detail, and as a result, it has been found that separation of a back metal from a solder alloy is attributable not only to the diffusion of Ni and the stress during solidification but also to the structure of the solder alloy. Furthermore, when the cross-section of a portion in which separation occurs was observed, it has also been found that an intermetallic compound layer is formed at the interface between the back metal and the solder alloy and the interface between the intermetallic compound layer and the back metal is separated. This infers the followings.

In a solder joint formed by die bonding, an intermetallic compound layer is formed at a place which is a bonding interface between a back metal and a solder alloy and which is in the solder alloy. At the same time, an intermetallic compound layer is formed at a place which is a bonding interface between a substrate and a solder alloy and which is in the solder alloy. In the solder alloy, when an Sn—Sb intermetallic compound phase is coarsened to the extent of coming into contact with both intermetallic compound layers, the back metal and the substrate are bonded partially only via the intermetallic compound layer and the Sn—Sb intermetallic compound phase. In such a portion, it is difficult to relax the stress applied to the bonding interface, and a separation occurs between the back metal and the intermetallic compound layer.

Based on the inference above, the present inventors thought that separation of the back metal from the solder alloy can be prevented by controlling, in the Sn—Sb intermetallic compound phase in the solder alloy, the particle size in the sheet thickness direction of the solder joint. However, since the intermetallic compound layer is not flat, unless the particle size of the Sn—Sb intermetallic compound phase is extremely small, the Sn—Sb intermetallic compound phase may come into contact with both intermetallic compound layers.

Accordingly, the present inventors have made further studies by paying attention to controlling a solder alloy layer exerting a stress relaxation action, in which in the structure constituting the solder alloy, the portion excluding intermetallic compound layers formed at both interfaces and the Sn—Sb intermetallic compound phase is defined as a solder alloy layer. As a result, it has been found that when a solder alloy layer exists between at least one intermetallic compound layer and the Sn—Sb intermetallic compound phase, the stress applied to the bonding interface is relaxed by the solder alloy layer and therefore, separation can be prevented, and the present invention has been accomplished. In other words, when an Sn—Sb intermetallic compound does not penetrate the solder alloy layer, separation can be prevented.

Then, with the assumption that the cause of the generation of such a coarse Sn—Sb intermetallic compound phase lies in the production step, the present inventors have examined each step in detail. As a result, it has been found that the cause lies in the step of cooling the solder alloy. Typically, it is common that as the cooling rate is lower, the particle size of the crystal phase grows more. As regards the conventional solder joint formation, there are many examples in which only the cooling rate is taken note of. In addition, the cooling rate that has been previously noticed indicates a cooling rate from the start of cooling until room temperature. On the other hand, the present inventors have thought that even when only the cooling rate in the conventionally noticed temperature range is controlled, coarsening of the Sn—Sb intermetallic compound phase cannot be prevented. This is because, in transferring from a heating step to a cooling step, there is a time period in which the temperature cannot be controlled, and it is thought that the Sn—Sb intermetallic compound phase has already been coarsened.

Here, the Sn—Sb-based solder alloy passes through the following phase precipitation process during cooling. First, when the cooling temperature falls below the precipitation start temperature of the SnSb phase, two phases of liquid phase and SnSb phase are present together. In the present invention, an Sn—Ag—Cu—Sb—Ni solder alloy containing Ag is used and therefore, when the cooling temperature falls below 230° C., four phases of SnSb phase, Sn phase, SnAg phase and SnCu phase are present together from the remaining liquid phase accounting for almost 90%.

Then, the present inventors have focused on the phase precipitation process during cooling of the Sn—Ag—Cu—Sb—Ni solder alloy. As a result, it has been found that when the cooling time from the temperature at which precipitation of the Sn—Sb intermetallic compound phase starts to 230° C. at which precipitation of the Sn—Sb-based intermetallic compound phase terminates is controlled, coarsening of the Sn—Sb intermetallic compound phase can be prevented. It has also been found that in turn, a solder alloy layer exists between at least one intermetallic compound layer and the Sn—Sb intermetallic compound phase.

Furthermore, the present inventors have thought that the Ni layer disappearance, which is one of causes of separation, is attributable to the peak temperature and retention time. The peak temperature and retention time need to be controlled for preventing occurrence of separation by wetting and spreading of the solder alloy and diffusion of Ni to the extent that Ni does not disappear. Accordingly, in addition to the heating conditions, the pressure reduction conditions in the heating atmosphere are also examined. As a result, fortunately, it has been found that when the heating temperature, heating retention time, peak temperature during heating and pressure reduction conditions are within predetermined ranges, the Ni layer remains, and separation of the back metal from the intermetallic compound layer is prevented.

In addition, in a case where the heating temperature, heating retention time, peak temperature during heating and pressure reduction conditions are within predetermined ranges, not only the separation is prevented due to remaining of Ni, but also non-wetting of solder alloy, splashing of molten solder, and chip cracking can be prevented.

The present invention achieved based on these findings is as follows.

(1) A solder joint in which an electronic component with a back metal is bonded to a substrate by a solder alloy, in which the solder alloy includes: a solder alloy layer having an alloy composition consisting of, in mass %: Ag: 2 to 4%, Cu: 0.6 to 2%, Sb: 9.0 to 12%, Ni: 0.005 to 1%, with the balance being Sn; an Sn—Sb intermetallic compound phase; a back metal-side intermetallic compound layer formed at an interface between the back metal and the solder alloy; and a substrate-side intermetallic compound layer formed at an interface between the substrate and the solder alloy, in which the solder alloy layer exists at least one of between the Sn—Sb intermetallic compound phase and the back metal-side intermetallic compound layer, and between the Sn—Sb intermetallic compound phase and the substrate-side intermetallic compound layer.

(2) The solder joint according to (1), in which as for the Sn—Sb intermetallic compound phase, in a cross-section of the solder joint, a Feret diameter of the Sn—Sb intermetallic compound phase, which is a distance between two parallel lines that are parallel to the substrate and sandwich the Sn—Sb intermetallic compound phase, is 60% or less of an average distance between the back metal of the electronic component and the substrate.

(3) The solder joint according to (1) or (2), in which the alloy composition further contains, in mass %, at least one of Co: 0.2% or less and Fe: 0.1% or less.

(4) The solder joint according to any one of (1) to (3), in which an average of distances between the back metal and the substrate is from 50 μm to 400 μm.

(5) The solder joint according to any one of (1) to (4), in which the back metal includes, in order from the electronic component side, a barrier layer containing at least one of Ti, Cr and V as a main component and a first metal layer containing at least one of Ni and Cu as a main component.

(6) The solder joint according to (5), including, between the electronic component and the barrier layer, a second metal layer containing at least one of Au and Al as a main component.

(7) The solder joint according to (5) or (6), including, between the first metal layer and the solder alloy, a third metal layer containing at least one of Au, Ag, Sn, Ni and Cu as a main component.

(8) The solder joint according to (7), including, between the third metal layer and the solder alloy, a fourth metal layer containing at least one of Au, Ag, Ni and Sn as a main component.

(9) A method for forming the solder joint according to any one of (1) to (8) in which an electronic component with a back metal is bonded to a substrate by a solder alloy, the method including: a heating step of heating a substrate above which an electronic component has been placed via a solder alloy at a temperature in a heating temperature region being at least 10° C. higher than a liquidus temperature of the solder alloy, such that a retention time in the heating temperature region is from 30 seconds to 5 minutes and a peak temperature in the retention time is from 270 to 330° C.; a pressure reduction step of reducing a pressure of a heating atmosphere to 100 Pa or less before a heating temperature of the substrate reaches 227° C. or reducing the pressure of the heating atmosphere to 100 Pa or less by starting pressure reduction at least 20 seconds after the heating temperature of the substrate reaches the heating temperature region, in which a pressure reduction time which is a time until the heating atmosphere is returned to a pressure region of at least 0.8 atm from the start of pressure reduction is from 30 seconds to 4 minutes; and a cooling step of, after the heating step, cooling a temperature region of from precipitation start temperature of the Sn—Sb intermetallic compound phase to 230° C. for 5 seconds or more and 2 minutes or less.

(10) The method for forming the solder joint according to (9), in which the heating step includes a preheating step of heating the substrate in a temperature region of from 150 to 220° C. for 2 to 10 minutes before the heating temperature of the substrate reaches 227° C.

(11) The method for forming the solder joint according to (9) or (10), in which in the pressure reduction step, the heating atmosphere is returned to a pressure of at least 0.8 atm 5 seconds to 2 minutes before a start of the cooling step.

(12) The method for forming the solder joint according to any one of (9) to (11), in which the pressure reduction step is started after a lapse of from 20 seconds to 3 minutes after the heating temperature of the substrate reaches the heating temperature region.

(13) The method for forming the solder joint according to any one of (9) to (12), in which the pressure reduction step is performed a plurality of time within the pressure reduction time.

BRIEF DESCRIPTION OF THE DRAWINGS

Each of FIGS. 1A-1D illustrates a schematic diagram of a solder joint in which a barrier layer and first to fourth metal layers are stacked.

Each of FIGS. 3A-3D is a cross-sectional schematic diagram of a solder joint.

Each of FIGS. 4A-4D shows cross-sectional SEM photographs of Invention Example 1 and Comparative Example 1.

DETAILED DESCRIPTION OF THE INVENTION

1. Solder Joint

Figure 1A:
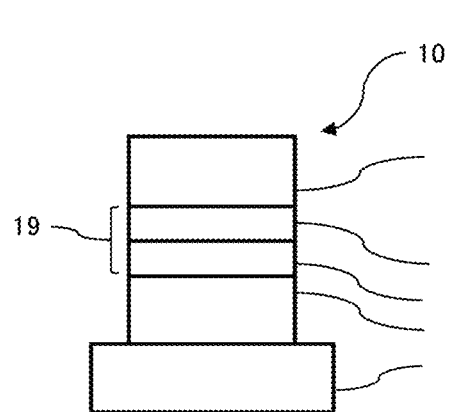
FIG. 1A is a schematic diagram in which a barrier layer 14 and a first metal layer 15 are stacked in order from the electronic component side.

In the solder joint according to the present invention, an electronic component is bonded to a substrate by a solder alloy. The electronic component, the substrate and the solder alloy are described in detail below.

(1) Electronic Component

The electronic component 11, 21, 31, 41, 51, 61, 71, 81 constituting the solder joint of the present invention is a chip obtained by, for example, after forming a semiconductor element such as resistor, transistor, capacitor and integrated circuit on a wafer, cutting out each semiconductor element section from the wafer. Examples of the wafer include Si, SiC and GaN. The electronic component is die-bonded by a solder alloy during mounting as a semiconductor package on a substrate.

In the electronic component, a back metal 19, 29, 39, 49, 59, 69, 79, 89 is formed at least on a surface on the bonding interface side with the solder alloy so as to enhance the adhesion strength to the solder alloy. In the case of applying soldering to both surfaces of the electronic component, a back metal may be formed on both surfaces of the electronic component.

The back metal of the present invention preferably includes, in order from the electronic component side, a barrier layer containing at least one of Ti, Cr and V as a main component, and a first metal layer containing at least one of Ni and Cu as a main component. The barrier layer and first to fourth metal layers, which can constitute the back metal, are described in detail below.

(1-1) Barrier Layer

In the present invention, in order to prevent an element constituting the first metal layer from diffusing toward the electronic component side, a barrier layer containing at least one of Ti, Cr and V as a main component is preferably provided between the substrate-side surface of the electronic component and the first metal layer. The film thickness of the barrier layer is not particularly limited but is preferably from 0.01 μm to 0.2 μm from the viewpoint of preventing diffusion.

Note here that in the present invention, Ag cannot be the main component of the barrier layer, because Ag diffuses earlier than Ni or Cu of the first metal layer during die bonding to bring about disappearance of the barrier layer. In addition, due to active diffusion of oxygen in Ag, the barrier layer is oxidized, which may cause separation.

(1-2) First Metal Layer

In the present invention, in order to improve the wettability with the solder alloy, it is preferable to include a first metal layer 15, 25, 35, 45, 55, 65, 75, 85 containing at least one of Ni and Cu as a main component. The film thickness of the first metal layer is preferably from 0.3 μm to 1.7 μm. This film thickness is a film thickness of the first metal layer remaining after diffusion has been progressed to a certain degree by die bonding. The film thickness of the first metal layer before die bonding is preferably from 0.5 μm to 2 μm. As described above, in the solder joint according to the present invention, unlike a conventional solder joint, the first metal layer maintains the above-described film thickness even after the solder joint is formed, such that the separation of the back metal from the solder alloy can be prevented.

Furthermore, in a case where the first metal layer is in contact with the solder alloy, the first metal layer is preferably not formed of Cu alone.

(1-3) Second Metal Layer

In the present invention, a second metal layer 26, 36, 46, 66, 86 containing at least one of Au and Al as a main component is preferably provided between the substrate-side surface of the electronic component and the barrier layer. In a case where a second metal layer is provided at this position, the adhesion strength of the electronic component to the barrier layer can be enhanced. The film thickness of the second metal layer after die bonding is not particularly limited but is preferably from 0.02 μm to 1 μm.

(1-4) Third Metal Layer

In the present invention, a third metal layer 37, 47, 77, 87 containing, as a main component, at least one selected from the group consisting of Au, Ag, Sn, Ni and Cu is preferably provided between the first metal layer and the intermetallic compound layer of the solder alloy. In a case where a third metal layer is provided at this position, wettability of the solder alloy can be enhanced. The film thickness of the third metal layer after die bonding is not particularly limited, but it is preferred that Au is from 0 to 0.1 μm, Ag is from 0 to 2 μm, Sn is from 0 to 5 μm, and Cu is from 0 to 5 μm. The third metal layer may disappear after die bonding.

In a case where the first metal layer does not contain Ni and the third metal layer is in contact with the solder alloy, the third metal layer preferably contains Ni so as to maintain wettability of the back metal with the solder alloy by avoiding exposure of the barrier layer. The film thickness of the third metal layer after die bonding in a case of using Ni is not particularly limited but may be from 0.3 μm to 1.7 μm.

(1-5) Fourth Metal Layer

In the present invention, a fourth metal layer 48, 88 containing at least one of Au, Ag, Ni and Sn as a main component is preferably provided between the third metal layer and the solder alloy. In a case where a fourth metal layer is provided at this position, excellent wettability can be maintained by preventing oxidation of the third metal layer. The film thickness of the fourth metal layer after die bonding is not particularly limited but it is preferred that Au is from 0 to 0.1 μm, Ag is from 0 to 2 μm, and Sn is from 0 to 5 μm. The fourth metal layer may disappear after die bonding. As the main component of the fourth metal layer, Au may be selected in a case where the third metal layer is Ag, and Ag, Sn or Au may be selected in a case where the third metal layer is Cu.

In a case where neither the first metal layer nor the third metal layer contains Ni, the fourth metal layer preferably contains Ni so as to maintain wettability of the back metal with the solder alloy by avoiding exposure of the barrier layer. The film thickness of the fourth metal layer in a case of using Ni is not particularly limited but may be from 0.3 μm to 1.7 μm.

(1-6) Stacked Structure of Solder Joint

Figure 1B:
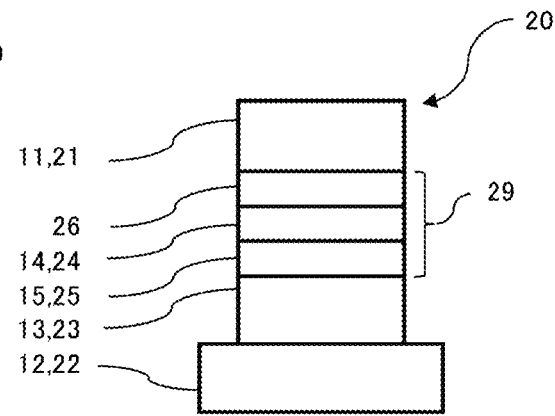
FIG. 1B is a schematic diagram in which a second metal layer 26, a barrier layer 24 and a first metal layer 25 are stacked in order from the electronic component side.
Figure 1C:
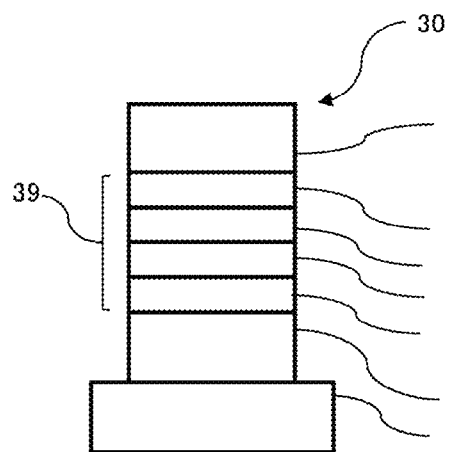
FIG. 1C is a schematic diagram in which a second metal layer 36, a barrier layer 34, a first metal layer 35 and a third metal layer 37 are stacked in order from the electronic component side.
Figure 1D:
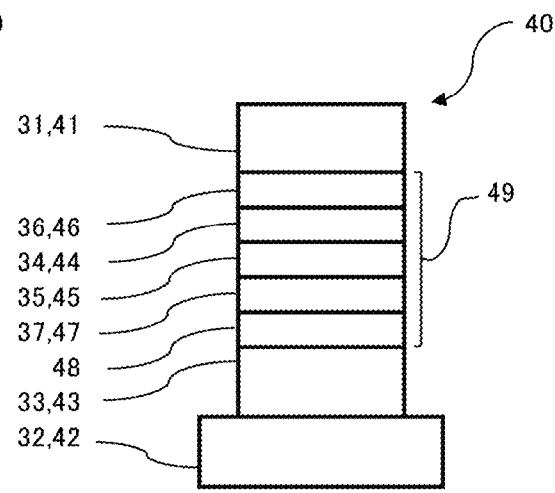
FIG. 1D is a schematic diagram in which a second metal layer 46, a barrier layer 44, a first metal layer 45, a third metal layer 47 and a fourth metal layer 48 are stacked in order from the electronic component side.

The stacked structure of the solder joint according to the present invention is described using FIGS. 1A-1D. Each of FIGS. 1A-1D illustrates a schematic diagram of a solder joint in which a barrier layer and first to fourth metal layers are stacked. FIG. 1A is a schematic diagram in which a barrier layer 14 and a first metal layer 15 are stacked in order from the electronic component side. FIG. 1B is a schematic diagram in which a second metal layer 26, a barrier layer 24 and a first metal layer 25 are stacked in order from the electronic component side. FIG. 1C is a schematic diagram in which a second metal layer 36, a barrier layer 34, a first metal layer 35 and a third metal layer 37 are stacked in order from the electronic component side. FIG. 1D is a schematic diagram in which a second metal layer 46, a barrier layer 44, a first metal layer 45, a third metal layer 47 and a fourth metal layer 48 are stacked in order from the electronic component side. As illustrated in FIG. 1A to FIG. 1D, in the solder joint according to the present invention, Al that is hardly wetted with the solder alloy may be used only in the second metal layer 26, 36, 46 and therefore, an Al layer does not come into contact with the solder alloy. On the other hand, none of the first metal layer 15, 25, 35, 45, the third metal layer 37, 47 and the fourth metal layer 48, which may be bonded to the solder alloy, contains Al because of a possibility of coming into contact with the solder alloy. The constituent elements of these layers can be selected as described above, such that the solder alloy used in the present invention is likely to be wet with them.

The method for forming each layer is not particularly limited, and vapor deposition, sputtering, plating, etc. can be applied.

In all of the barrier layer and first to fourth metal layers, the main component element is specified, and the "main component" as used in the present invention indicates an element accounting for 50 mass % or more of each layer. Each of these layers is more preferably composed of a single element. Other than the main component, unavoidable impurities may be contained. Even in a case where unavoidable impurities are contained, the above-described effects are not affected. Examples of the unavoidable impurities include an element diffused from the back metal. In addition, even in a case where an element not contained in the present invention is contained as an unavoidable impurity, the above-described effects are not affected.

(2) Substrate

The substrate 12, 22, 32, 42, 52, 62, 72, 82 constituting the solder joint of the present invention indicates a glass fiber-reinforced epoxy-based printed circuit board such as highly heat-resistant FR4 or a polyimide-based substrate, a ceramic substrate such as DBA (Direct Bonded Aluminum) and DBC (Direct Bonded Copper), a metal substrate such as Cu, a Cu lead frame, etc. An electronic component is mounted on the substrate via a solder alloy. The substrate itself may be subjected to metal plating. A metal plating may be formed on both surfaces of the substrate and may be multilayered.

The average of distances between the back metal of the electronic component and the substrate is not particularly limited but, as a distance that can be formed in practice, is usually from 50 μm to 400 μm.

In the present invention, the average of distances between the back metal of the electronic component and the substrate can be determined by measuring, at four corners of the electronic component, the height from the top surface of the substrate to the top surface of the electronic component by means of, for example, a confocal microscope or a laser displacement meter, and calculating a difference between the weighted average of respective heights and the height of the electronic component including the back metal.

(3) Solder Alloy

In the present description, unless otherwise indicated, "%" regarding the solder alloy composition means "mass %". The solder alloy con13, 23, 33, 43, 53, 63, 73, 83 stituting the solder joint according to the present invention is composed of the following elements.

(3-1) Ag: From 2 to 4%

Ag is an element that enhances the reliability. If the Ag content is less than 2%, the stress during solidification cannot be relaxed. In terms of the lower limit, the Ag content is 2% or more, preferably 2.5% or more, more preferably 2.9% or more.

On the other hand, if the Ag content exceeds 4%, a coarse intermetallic compound phase such as $Ag_3Sn$ is locally generated, which may cause separation. Unlike an Sn—Sb-based intermetallic compound phase, it is very difficult to control the generation of the $Ag_3Sn$ intermetallic compound phase by a profile. In terms of the upper limit, the Ag content is 4% or less, preferably 3.5% or less, more preferably 3.1% or less.

(3-2) Cu: From 0.6 to 2%

Cu is an element that not only adjusts the melting point of the solder alloy but also, in a case of having Ni in the first metal layer, controls the diffusion of the Ni layer to prevent the separation of the back metal. If the Cu content is less than 0.6%, diffusion of Ni may proceed to cause an occurrence of the separation. In terms of the lower limit, the Cu content is 0.6% or more, preferably 0.7% or more, more preferably 0.95% or more.

On the other hand, if the Cu content exceeds 2%, the melting point of the solder alloy rises significantly, and the performance of IC, etc. formed on a silicon chip of the electronic component may deteriorate in die bonding. In terms of the upper limit, the Cu content is 2% or less, preferably 1.5% or less, more preferably 1.05% or less.

(3-3) Sb: From 9.0 to 12%

Sb is an element that not only controls the particle size of the Sn—Sb intermetallic compound phase but also enhances the reliability. If the Sb content is less than 9.0%, the Sb concentration in Sn is not increased, and the reliability of the solder alloy is poor. Accordingly, the Sb content needs to be such an amount as to cause precipitation of the Sn—Sb intermetallic compound phase. In terms of the lower limit, the Sb content is 9.0% or more, preferably 10.0% or more.

On the other hand, if the Sb content exceeds 12%, the particle size of the Sn—Sb intermetallic compound phase is likely to be coarsened, which may cause separation. In terms of the upper limit, the Sb content is 12% or less, preferably 11% or less, more preferably 10.5% or less.

(3-4) Ni: From 0.005 to 1%

Ni is an element that not only adjusts the melting point of the solder alloy but also, in a case of having a Ni layer in the back metal, prevents the diffusion of the Ni layer to enhance the adhesion strength to the solder alloy and prevent the separation of the back metal. If the Ni content is less than 0.005%, the adhesion strength to the electronic component may decrease to cause an occurrence of the separation. In terms of the lower limit, the Ni content is 0.005% or more, preferably 0.010% or more, more preferably 0.015% or more.

On the other hand, if the Ni content exceeds 1%, the melting point of the solder alloy rises excessively, and the semiconductor element may be thermally damaged during die bonding. In terms of the upper limit, the Ni content is 1% or less, preferably 0.1% or less, more preferably 0.025% or less.

(3-5) At Lease One of Co: 0.2% or Less and Fe: 0.1% or Less

These elements are an optional element that prevents melting of Ni and can thereby prevent the separation of the back metal. In a case where the contents of these elements are not more than the upper limit, the melting point of the solder alloy is not excessively high, and the semiconductor element is not thermally damaged during die bonding. In terms of the upper limit, the Co content is preferably 0.2% or less, more preferably 0.1% or less. In terms of the upper limit, the Fe content is preferably 0.1% or less, more preferably 0.05% or less.

On the other hand, in order to bring out the effects of the addition of these elements, in terms of the lower limit, the Co content is preferably 0.005% or more, more preferably 0.01% or more. In terms of the lower limit, the Fe content is preferably 0.005% or more, more preferably 0.01% or more.

(3-6) Balance Sn

The balance of the solder alloy constituting the solder joint of the present invention is Sn. Other than the above-described elements, unavoidable impurities may be contained. Even in a case where unavoidable impurities are contained, the above-described effects are not affected. In the present invention, examples of the unavoidable impurities include an element diffused from the back metal. In addition, as described later, even in a case where an element not contained in the present invention is contained as an unavoidable impurity, the above-described effects are not affected.

(3-7) Alloy Structure

The solder alloy constituting the solder joint according to the present invention includes a back metal-side intermetallic compound layer, a substrate-side intermetallic compound layer, an Sn—Sb intermetallic compound phase, and a solder alloy layer. These are described in detail below.

(3-7-1) Back Metal-Side Intermetallic Compound Layer

The solder alloy of the present invention contains Sn and Cu and therefore, a back metal-side intermetallic compound layer such as $Cu_6Sn_5$ and $Cu_3Sn$ is formed at the interface between the back metal and the solder alloy. In addition, in the back metal, in a case where the metal layer in contact with the solder alloy contains Ni, a back metal-side intermetallic compound layer such as $(Cu, Ni)_6Sn_5$ and $(Cu, Ni)_3Sn$ is also formed.

The back metal-side intermetallic compound layer in the present invention is "a series of intermetallic compound layers" formed at the interface between the back metal and the solder alloy and even when the constituent elements are the same, excludes "an isolated intermetallic compound phase" liberated from "a series of intermetallic compound layers". More specifically, in a case where the later-described solder alloy layer exists between "a series of intermetallic compound layers" and "an isolated intermetallic compound phase", the "isolated intermetallic compound phase" does not fall under "a series of intermetallic compound layers". This is because, when a solder alloy layer exists therebetween, even if the Sn—Sb intermetallic compound is put into contact with the "isolated intermetallic compound phase", a stress applied to the bonding interface can be relaxed due to existence of the solder alloy layer.

(3-7-2) Substrate-Side Intermetallic Compound Layer

In the solder alloy according to the present invention, a substrate-side intermetallic compound layer such as $Cu_6Sn_5$ and $Cu_3Sn$ is formed at the interface between the substrate and the solder alloy. In addition, when a Ni plating is formed on the substrate, a substrate-side intermetallic compound layer such as $(Cu, Ni)_6Sn_5$ and $(Cu, Ni)_3Sn$ is also formed.

As with the back metal-side intermetallic compound layer, the substrate-side intermetallic compound layer in the present invention is "a series of intermetallic compound layers" formed at the interface between the substrate and the solder alloy and even when the constituent elements are the same, excludes "an isolated intermetallic compound phase" liberated from "a series of intermetallic compound layers". This is because, when a solder alloy layer exists therebetween, even if the Sn—Sb intermetallic compound is in contact with the "isolated intermetallic compound phase", a stress applied to the bonding interface can be relaxed due to existence of the solder alloy layer.

(3-7-3) Sn—Sb Intermetallic Compound Phase

As for the Sn—Sb intermetallic compound of the present invention, a solder alloy layer needs to exist at least one of between the Sn—Sb intermetallic compound phase and the back metal-side intermetallic compound layer and between the Sn—Sb intermetallic compound phase and the substrate-side intermetallic compound layer.

The solder joint according to the present invention employs a solder alloy having a Sb content of 9.0% or more and therefore, the Sn—Sb intermetallic compound phase is likely to be coarsened. When the Sn—Sb-based intermetallic compound phase is coarsened to such extent that the Sn—Sb-based intermetallic compound phase locally penetrates the solder alloy existing between the back metal-side intermetallic compound layer and the substrate-side intermetallic compound layer, the Sn—Sb-based intermetallic compound phase comes into contact with both intermetallic compound layers. In this case, the Sn—Sb intermetallic compound is not deformed because of its high strength and cannot relax the peripheral stress. Furthermore, the both intermetallic compound layers above are harder than the solder alloy and likewise cannot relax the stress. As a result, a portion capable of relaxing the stress is not present between the back metal and the substrate, and separation occurs at the interface between the back metal and the intermetallic compound layer of the solder alloy. This separation gives rise to falling off or conduction failure of the electronic component.

In the present invention, the particle size of the Sn—Sb intermetallic compound phase is preferably smaller. In the present invention, in a cross-section of the solder joint, the diameter of the Sn—Sb intermetallic compound phase, which is the distance between two parallel lines when the Sn—Sb intermetallic compound phase is sandwiched by two parallel lines parallel to the substrate, is designated as the Feret diameter. The Feret diameter is preferably 60% or less of the average distance between the back metal of the electronic component and the substrate, more preferably less than 50% thereof, still more preferably 33.3% or less thereof.

The Feret diameter of the Sn—Sb intermetallic compound phase is preferably from 10 μm to 350 μm, more preferably from 10 μm to 150 μm, still more preferably from 15 μm to 30 μm, although it depends on the distance between the back metal of the electronic component and the substrate.

In the present invention, as for the particle size of the Sn—Sb intermetallic compound phase, 2 to 5 particles are extracted in descending order in size when they are visually viewed in an observation at a magnification of 150 to 1,000 times with a microscope, photographed, and the extracted 2 to 5 particles are measured for Feret diameters. The maximum value among the Feret diameters of extracted 2 to 5 particles is regarded as the Feret diameter. In the present invention, the Feret diameter is a directed tangential diameter defined by the distance between two parallel tangential lines sandwiching a particle (The Society of Powder Technology (compiler), "Particle Measurement Technique", Nikkan Kogyo Shimbun, Ltd., p. 7 (1994)). In the present invention, the Sn—Sb intermetallic compound phase is sandwiched by two parallel lines parallel to the substrate, and the distance between two parallel lines is regarded as the Feret diameter.

In the present invention, the Sn—Sb intermetallic compound phase may be formed of one crystal grain or a plurality of crystal grains which are connected to each other. In a case where a plurality of crystal grains are connected, a group of connected crystal grains is regarded as an Sn—Sb intermetallic compound phase. Likewise, in a case where a plurality of crystal grains are connected, the Feret diameter is a diameter of a group of connected crystal grains. In addition, the "Sn—Sb intermetallic compound phase" as used in the present invention indicates an SnSb phase. Furthermore, since the intermetallic compound layer is not flat, even when the shortest distance between both intermetallic compound layers is smaller than the Feret diameter, it is highly likely that the Sn—Sb intermetallic compound phase does not come into contact with both intermetallic compound layers.

(3-7-4) Solder Alloy Layer

In the present invention, the solder alloy layer indicates a portion remaining when the back metal-side intermetallic compound layer, the substrate-side intermetallic compound layer and the Sn—Sb intermetallic compound phase from the solder alloy are excluded. Furthermore, in a case where the above-described "isolated intermetallic compound phase" is present, the "isolated intermetallic compound phase" is also excluded from the solder alloy layer.

The solder alloy layer in the present invention has lower hardness than those excluded layers and phases and can relax the stress applied to the bonding interface. More specifically, the solder alloy layer in the present invention has a function as a shock absorbing material of the solder joint according to the present invention.

In the solder alloy layer, a crystal phase having hardness equal to or greater than that of the intermetallic compound layer or Sn—Sb intermetallic compound phase, such as $Ag_3Sn$, is sometimes contained. However, this does not affect the effects of the present invention because the crystallization amount of such a crystal phase is small.

From the viewpoint of bringing out the effects above, the film thickness of the solder alloy layer existing at least one of between the Sn—Sb intermetallic compound phase and the back metal-side intermetallic compound layer and between the Sn—Sb intermetallic compound phase and the substrate-side intermetallic compound layer is preferably 1 μm or more, more preferably 5 μm or more.

2. Method for Forming a Solder Joint

The method for forming a solder joint according to the present invention is a method of bonding an electronic component having a back metal to a substrate by a solder alloy. Each step is described in detail below.

(1) Heating Step

In the heating step, a substrate above which an electronic component has been placed via the solder alloy is heated to a temperature in the heating temperature region which is at least 10° C. higher than the liquidus temperature of the solder alloy, and is heated such that the retention time in the heating temperature region is from 30 seconds to 5 minutes and the peak temperature in the retention time is from 270 to 330° C.

(1-1) Heating Conditions

In the method for forming a solder joint according to the present invention, a solder alloy and an electronic compound are placed in this order above a substrate. The placing direction of the electronic component is a direction in which the back metal of the electronic component abuts against the solder alloy. In a case where back metals are provided on both surfaces of the electronic component, a suitable surface is selected depending on the function, etc. of the electronic component.

In the heating step of the present invention, the substrate needs to be heated to a temperature in the heating temperature region at least 10° C. higher than the liquidus temperature of the solder alloy. This is because, in a case where the heating temperature is within a range of this temperature region, the solder alloy turns from a semi-molten state to a molten state, and the molten solder sufficiently wets and spreads over the back metal of the electronic component and the substrate electrode.

In the present invention, in order to prevent disappearance of the first metal layer, third metal layer and fourth metal layer, which can become a layer coming into contact with the solder alloy, the retention time in the heating temperature region above needs to be from 30 seconds to 5 minutes. If in terms of the lower limit the retention time is less than 30 seconds, the wettability deteriorates. In terms of the lower limit, the retention time is preferably 1 minute or more, more preferably 2 minutes or more. On the other hand, if in terms of the upper limit the retention time exceeds 5 minutes, the first metal layer may disappear to cause separation at the interface between the back metal-side intermetallic compound layer of the solder alloy and the back metal. In terms of the upper limit, the retention time is preferably 4.5 minutes or less.

Next, the substrate above which the solder alloy and the electronic component have been mounted is heated in a heating furnace. The peak temperature during heating is a temperature region of 270 to 330° C. The peak temperature of the present invention needs to be 270° C. or more so as to promote the melting of the Sn—Sb intermetallic phase and bring out good wettability. The liquidus temperature varies depending on the solder alloy composition and therefore, the peak temperature is adjusted in the temperature region above depending on the liquidus temperature of the solder alloy. On the other hand, if the peak temperature is too high, thermal damage may occur to the electronic component or the diffusion of the first metal layer, etc. may be accelerated such that the first metal layer disappears. For this reason, in terms of the upper limit, the peak temperature is set to be 330° C. or less.

(1-3) Other Conditions

In the heating step of the present invention, the temperature rise rate is preferably from 0.5° C./s to 5° C./s. Within this range, generation of voids can be sufficiently prevented and the wettability can be improved.

Furthermore, in the case of using a flux or a flux-containing solder product, the atmosphere in steps subsequent to the heating step is preferably an air, nitrogen, inert gas, hydrogen, formic acid or other reducing gas atmosphere. In the case of not using a flux and supplying only a solder alloy, the atmosphere is preferably a mixed gas atmosphere of a reducing gas such as hydrogen and formic acid and an inert gas such as nitrogen. As described later, in returning the heating atmosphere to a pressure of at least 0.8 MPa in the pressure reduction step, the atmosphere is preferably returned to the pressure by introducing an atmosphere gas except for air.

(1-4) Preheating Step

In the heating step of the present invention, in order to uniformly heat the substrate and clean an oxide from the substrate and in the case of supplying a flux or a flux-containing solder product to the substrate, to remove an organic solvent, a preheating step of heating the substrate in a temperature region of 150 to 220° C. for 2 to 10 minutes before the heating temperature of the substrate reaches 227° C., may be provided.

(1-5) Usage Form of Solder Alloy

In the present invention, a flux or a paste containing the above-described solder alloy may be used. Components other than the flux or the solder alloy used in the paste are not particularly limited, and common components may also be used.

The shape of the solder alloy in the present invention is not particularly limited as long as it is a preform such as ball, ribbon, washer, pellet, wire and chip.

(2) Pressure Reduction Step

In the pressure reduction step of the present invention, the pressure of the heating atmosphere is reduced to 100 Pa or less before the heating temperature of the substrate reaches 227° C., or pressure reduction is started at least 20 seconds after the heating temperature of the substrate reaches the heating temperature region and thus the pressure of the heating atmosphere is reduced to 100 Pa or less, in which the pressure reduction time which is a time until the heating atmosphere is returned to a pressure region of at least 0.8 atm from the start of pressure reduction needs to be from 30 seconds to 4 minutes.

In the present invention, in order to avoid an abrupt change in atmospheric pressure while the solder alloy is in a semi-molten state, the pressure reduction to 100 Pa or less can be performed at either one of two kinds of timings. Both are described in detail.

(2-1) The Pressure of the Heating Atmosphere is Reduced to 100 Pa or Less Before the Heating Temperature of the Substrate Reaches 227° C.

In a case where the pressure reduction is performed under this condition, the pressure is not reduced while the solder alloy is in a semi-molten state, and the pressure has been reduced before melting of the solder alloy starts, such that splashing of the solder alloy can be prevented and the mounting failure can be reduced. On the other hand, if the pressure of the heating atmosphere is reduced to 100 Pa or less after the heating temperature of the substrate has reached 227° C., an abrupt change in the atmospheric pressure occurs while the solder alloy is in a semi-molten state, and the solder alloy is splashed out.

The temperature of 227° C. is employed because in particular, this is a solidus temperature of the solder alloy used in the present invention or a temperature close to it.

In the present invention, it is sufficient as long as the heating atmosphere pressure is reduced to 100 Pa or less. The heating atmosphere pressure is preferably 50 Pa or less, more preferably 10 Pa or less.

(2-2) Pressure Reduction is Started at Least 20 Seconds after the Heating Temperature of the Substrate Reaches the Heating Temperature Region and Thus the Pressure of the Heating Atmosphere is Reduced to 100 Pa or Less If the pressure reduction is started before wetting of the solder alloy in a molten state is finished, the void expands due to an abrupt pressure change and therefore, the original wettability of the solder alloy itself cannot be exerted, resulting in the occurrence of non-wetting. Accordingly, the pressure reduction step needs to be started at least 20 seconds after the temperature reaches the above-described heating temperature region. The pressure reduction start time is preferably after a lapse of from 20 seconds to 3 minutes after the temperature reaches the heating temperature region, more preferably after a lapse of from 1 to 2 minutes after the temperature reaches the heating temperature region. Within this range, non-wetting can be prevented.

In the pressure reduction step of the present invention, the pressure is preferably returned to at least 0.8 atm 5 seconds to 2 minutes before the start of the cooling step. The time period in which voids are readily generated varies depending on various factors such as film thickness of the first metal layer, heating temperature, temperature rise rate and heating atmosphere, but in a case where the final pressure reduction treatment is performed 5 seconds to 2 minutes before the start of cooling, voids expanded during pressure reduction are contracted, and non-wetting can be prevented by filling the void part with a solder before dewetting. The time at which the pressure is returned to a pressure of at least 0.8 atm is preferably from 10 seconds to 1 minute before the start of the cooling step.

From the viewpoint of avoiding the quantitative lack of the solder filled into the void part and preventing non-wetting, the lower limit of the pressure restored after the pressure reduction is 0.8 atm or more, preferably 0.9 atm or more, more preferably 1 atm or more. The upper limit is not particularly limited but the pressure restored after the pressure reduction may be 3 atm or less.

(2-3) Pressure Reduction Time

In the present invention, in order to bring out excellent wettability of the solder alloy itself by preventing the generation of voids during melting of the solder alloy and to prevent disappearance of the first metal layer, the pressure reduction time which is a time until the heating atmosphere is returned to a pressure region of at least 0.8 atm from the start of pressure reduction, is from 30 seconds to 4 minutes.

If the pressure reduction time is less than 30 seconds, the void expands during pressure reduction and since a gas in the void or a flux component having lost its activity remains and is scarcely discharged from the solder-bonded part, even when the pressure is returned to at least 0.8 atm, the void-reducing effect cannot be greatly expected. In addition, if the pressure is reduced before wetting of the solder alloy in a molten state is finished, the void ready to contract expands and therefore, the original wettability of the solder alloy itself cannot be exerted, resulting in that the voids rather remain and non-wetting occurs. Accordingly, the pressure reduction step needs to be started at least 30 seconds after the temperature reaches at least 10° C. higher than the liquidus temperature of the solder alloy.

On the other hand, if the pressure reduction time exceeds 4 minutes, a thin remaining molten solder in the electrode portion which is in contact with voids spread during pressure reduction is consumed as the reaction layer grows, and partial exposure of the reaction layer in the void, a so-called dewetting phenomenon, occurs in bonding parts for die bonding, i.e., the interface between the back metal of the electronic component and the solder alloy and the interface between the solder alloy and the substrate electrode. Once dewetting occurs, the electrode is very resistant to wetting and is not again wetted with the solder alloy during pressure reduction, thereby causing non-wetting. In addition, pressure reduction for a long time leads to the elongation of the melting time and therefore, the first metal layer may disappear.

In the pressure reduction step of the present invention, the substrate is repeatedly exposed to environments of a pressure of at least 0.8 atm and a reduced pressure, and the molten solder is caused to flow, such that the solder can physically wet and be spread to the non-wetting portion. For this reason, in the present invention, the pressure reduction is preferably performed a plurality of times within 4 minutes. Considering the pressure reduction time, etc., the step is preferably performed 2 to 3 times. For example, the profile of reducing the pressure two times may be performed at the following timings. As the first time, the pressure reduction is started before the temperature reaches 230° C. in the heating step such that the pressure of the heating atmosphere is reduced to 100 Pa or less and after the pressure reduction is once terminated at the liquidus temperature, the pressure is returned. As the second time, the pressure reduction is restarted after a lapse of from 20 seconds to 3 minutes after the temperature reaches the peak temperature, and the pressure is returned 5 seconds to 2 minutes before starting the cooling step.

It is sufficient to perform the pressure reduction step of the present invention by a simple pressure reduction unit using a rotary pump.

(4) Cooling Step

In the cooling step of the present invention, after the heating retention step, cooling in the temperature region of from precipitation start temperature of the Sn—Sb intermetallic compound phase to 230° C. is conducted for 5 seconds or more and 2 minutes or less.

In the present invention, coarsening of the Sn—Sb-based intermetallic compound phase in the solder alloy can be prevented by performing a cooling control during the solidification of the solder alloy. In the Sn—Sb-based solder alloy containing Ag and Cu used in the present invention, when the temperature falls below 230° C., four phases of SnSb phase, Sn phase, SnAg phase and SnCu phase are crystallized. In the present invention, the cooling rate in the temperature region from the precipitation start temperature of the Sn—Sb intermetallic compound phase to 230° C., which is the production temperature region of the Sn—Sb intermetallic compound phase, is controlled, thereby preventing coarsening of the Sn—Sb-based intermetallic compound phase in the solder alloy, and the separation of the back metal from the solder alloy can be prevented. In addition, with this effect, the alloy structure can be controlled such that the solder alloy layer exists between at least one intermetallic compound layer and the Sn—Sb intermetallic compound phase. Accordingly, in the present invention, it is only necessary to control the cooling rate from the precipitation start temperature of the Sn—Sb intermetallic compound phase to 230° C., and it is preferable to control the cooling rate from 270 to 230° C.

Furthermore, as for the cooling time, from the viewpoint of preventing the coarsening of the Sn—Sb intermetallic compound phase, the cooling time in the temperature region above is set to be 5 seconds or more and 2 minutes or less. If the cooling time is less than 5 seconds, the variation in cooling on the substrate is increased and furthermore, since a thermal impact is imposed, a non-uniform stress is generated in the Si chip, leading to breakage of the Si chip. In terms of the lower limit, the cooling time is preferably 10 seconds or more, more preferably 30 seconds or more. On the other hand, if the cooling time exceeds 2 minutes, the Sn—Sb-based intermetallic compound phase is coarsened, which may cause separation. In terms of the upper limit, the cooling time is preferably 1.5 minutes or less, more preferably 1 minute or less.

EXAMPLES

1. Invention Example 1

(1) Solder Joint Formation

The method for forming a solder joint of Invention Example 1 and the evaluation method for each evaluation item are described below.

Figure 2:
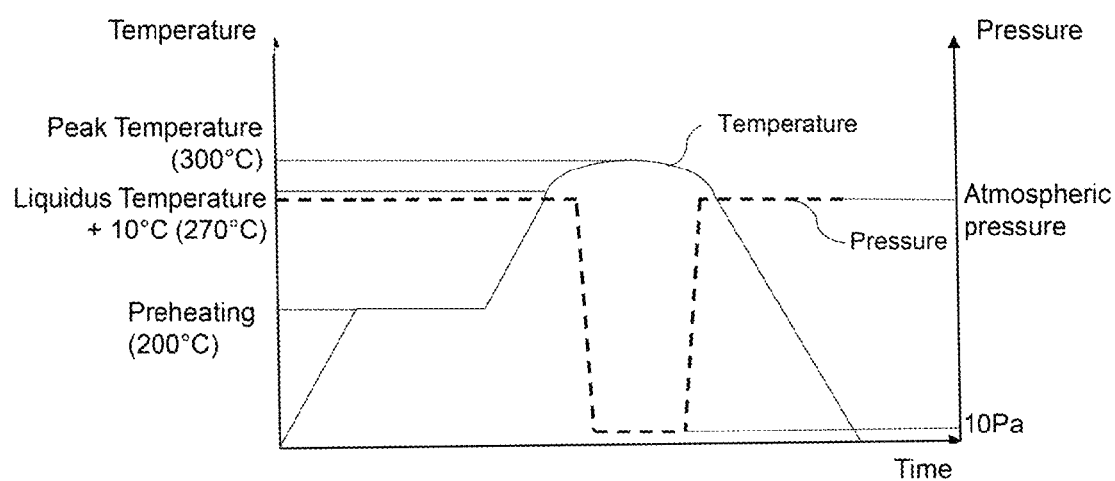
FIG. 2 is one example of the profiles of the temperature and time and the atmosphere pressure and time, illustrating the method for forming a solder joint according to the present invention.

A preform of an Sn-3Ag-1Cu-10Sb-0.02Ni solder alloy (liquidus temperature: 256° C.) having a sheet thickness of 100 μm was mounted on a Cu-made lead frame (substrate) subjected to Ni plating, and an IC chip (electronic component) of 5 mm×5 mm×200 μm$^r$ including a back metal on the substrate bonding surface side of a silicon chip was then mounted on the solder alloy. The back metal is a back metal obtained by stacking, in order, a Ti layer having a film thickness of 0.05 μm as a barrier layer and a Ni layer having a film thickness of 1 μm as a first metal layer. The mounting direction was made to be a direction in which in the IC chip including the back metal, the Ni layer abuts against the preform of the solder alloy. The substrate on which the solder alloy preform and the IC chip had been mounted was introduced into a heating furnace, and die bonding was performed by conducting the heating and cooling under the conditions shown in Table 1. The conditions shown in Invention Example 1 of Table 1 give the temperature profile illustrated in FIG. 2.

A mixed gas of formic acid and nitrogen was used for the heating atmosphere. After the substrate was introduced into the heating furnace, the pressure was reduced to 10 Pa by a rotary pump 1 minute after the substrate temperature reached 270° C., the mixed gas was introduced just prior to the elapse of 100 seconds after starting the pressure reduction to perform a venting, and the pressure was returned to atmospheric pressure up to the elapse of 100 seconds after starting the pressure reduction. When 10 seconds had elapsed after the completion of venting, the heating furnace was cooled such that the cooling time from 270° C. to 230° C. is 60 seconds, and the solder joint of Invention Example 1 was thus formed.

(2) Evaluation

With respect to the formed solder joint, the back metal of the silicon chip was observed as follows so as to check the "remaining of Ni layer", "penetration of SnSb phase", "separation", "non-wetting", "splashing" and "chip breakage".

In a cross-section of the back metal of the silicon chip, respective phases were classified based on the contrast difference presented by the SEM monitor at a magnification of 300 times and 10,000 times by using JSM-6610LV manufactured by JEOL Ltd., and the SnSb phase (Sn—Sb intermetallic compound phase), Ni layer, Ti layer, Si, and intermetallic compound layer formed at the bonding interface (the back metal-side intermetallic compound formed at the interface between the electronic component and the solder alloy, the substrate-side intermetallic compound formed at the interface between the substrate and the solder alloy) were identified by the quantitative analysis and metallurgical knowledge.

"Remaining of Ni Layer", "Penetration of SnSb Phase", "Separation", "Non-Wetting", "Splashing", "Chip Breakage"

A cross-section of the back metal of the silicon chip was enlarged at 10,000 times on the SEM monitor, and the remaining of Ni layer was checked at arbitrary 10 points. In addition, whether the SnSb phase penetrated the solder alloy or not was confirmed on an image photographed with SEM. In the case where the Ni layer had disappeared, the presence or absence of separation of the Ti layer from the solder alloy was confirmed. In addition, in the case where the Ni layer remained, the presence or absence of non-wetting of the Ni layer with the solder alloy was confirmed.

The "remaining of Ni layer" was rated as "A" in a case where the Ni layer remained, and rated as "C" in a case where the Ni layer did not remain.

The "penetration of SnSb phase" was rated as "none" in a case where the SnSb phase did not penetrate the solder alloy layer and was in contact with either the back metal-side intermetallic compound layer or the substrate-side intermetallic compound layer or in contact with both intermetallic compound layers, and rated as "present" in a case where the SnSb phase penetrates the solder alloy layer and was in contact with both intermetallic compounds.

The "separation" was rated as "none" in a case where the separation of the Ti layer from the solder layer was not confirmed in any portions, and rated as "present" in a case where the separation was present in some portion.

The "non-wetting" was rated as "none" in a case where no gap was present between the Ni layer and the solder alloy and non-wetting did not occur, and rated as "present" in a case where a gap was present in some portion and non-wetting occurred.

The presence or absence of the "splashing" was rated as "none" in a case where the solder was not splashed around the substrate of the obtained solder joint, and rated as "present" in a case where the solder was splashed.

As for the "chip breakage", the presence or absence of the breakage of the silicon chip was confirmed by visually observing the outer appearance of the formed solder joint. The chip breakage was rated as "none" in a case where the silicon chip was not broken, and rated as "present" in a case where the silicon chip was broken at some portion.

2. Invention Examples 2 to 24, Comparative Examples 1 to 12

Figures 3A, 3B:
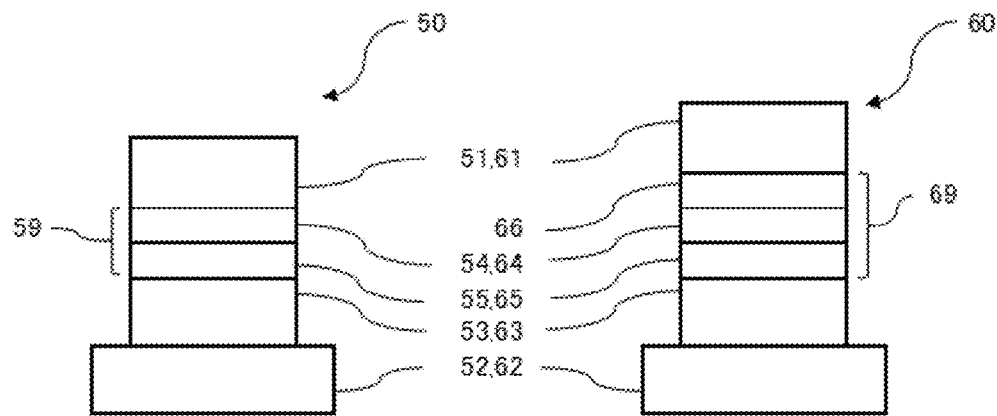
FIG. 3A is a schematic diagram of Invention Example 1.
FIG. 3B is a schematic diagram of Invention Example 8.
Figures 3C, 3D:
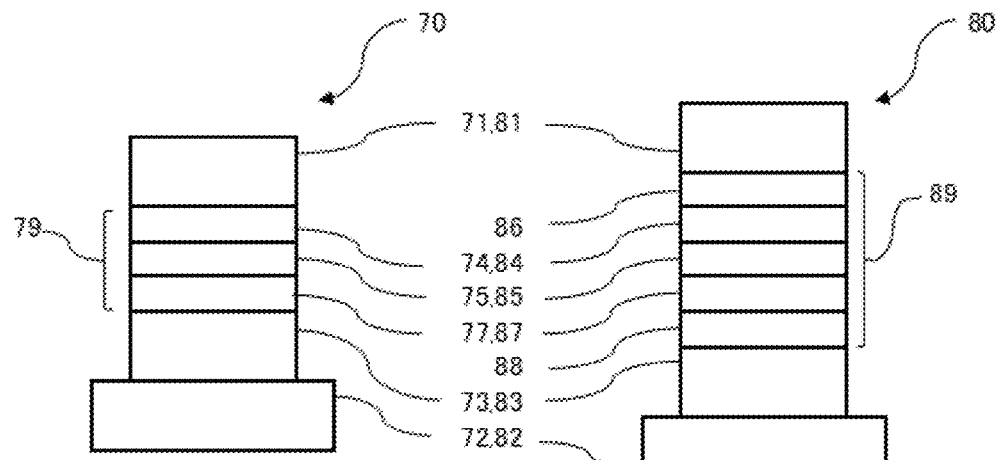
FIG. 3C is a schematic diagram of Invention Example 9.
FIG. 3D is a schematic diagram of Invention Example 10.

In these Examples, the evaluations were performed in the same manner as in Invention Example 1. In order to clearly show the stacked state of the solder joint, each of FIGS. 3A-3D illustrates a cross-sectional schematic diagram of the solder joint. FIG. 3A is a schematic diagram of Invention Example 1, FIG. 3B is a schematic diagram of Invention Example 8, FIG. 3C is a schematic diagram of Invention Example 9, and FIG. 3D is a schematic diagram of Invention Example 10.

The results are shown in Table 1.

TABLE 1

| | Alloy Composition (mass %) | | | | | | Back Metal | | | | |
|---|---|---|---|---|---|---|---|---|---|---|---|
| | | | | | | | Second Metal Layer | Barrier Layer | First Metal Layer | Third Metal Layer | Fourth Metal Layer |
| | Sn | Ag | Cu | Sb | Ni | Others | | | | | |
| Invention Example 1 | Bal. | 3 | 1 | 10 | 0.02 | | | Ti | Ni | | |
| Invention Example 2 | Bal. | 3 | 1 | 9 | 0.02 | | | Ti | Ni | | |
| Invention Example 3 | Bal. | 3 | 1 | 12 | 0.02 | | | Ti | Ni | | |
| Invention Example 4 | Bal. | 3 | 1 | 10 | 0.01 | | | Ti | Ni | | |
| Invention Example 5 | Bal. | 3 | 1 | 10 | 1 | | | Ti | Ni | | |
| Invention Example 6 | Bal. | 3 | 1 | 10 | 0.02 | Co 0.01 | | Ti | Ni | | |
| Invention Example 7 | Bal. | 3 | 1 | 10 | 0.02 | Fe 0.01 | | Ti | Ni | | |
| Invention Example 8 | Bal. | 3 | 1 | 10 | 0.02 | | Al | Ti | Ni | | |
| Invention Example 9 | Bal. | 3 | 1 | 10 | 0.02 | | | Ti | Ni | Ag | |
| Invention Example 10 | Bal. | 3 | 1 | 10 | 0.02 | | Al | Ti | Ni | Ag | Au |

TABLE 1-continued

|  |  |  |  |  |  |  |  |  |  |
|---|---|---|---|---|---|---|---|---|---|
| Invention Example 11 | Bal. | 3 | 1 | 10 | 0.02 | Al | Ti | Ni | Cu | Ag |
| Invention Example 12 | Bal. | 3 | 1 | 10 | 0.02 | Al | Ti | Ni | Sn | Au |
| Invention Example 13 | Bal. | 3 | 1 | 10 | 0.02 |  | Ti | Ni |  |  |
| Invention Example 14 | Bal. | 3 | 1 | 10 | 0.02 |  | Ti | Ni |  |  |
| Invention Example 15 | Bal. | 3 | 1 | 10 | 0.02 |  | Ti | Ni |  |  |
| Invention Example 16 | Bal. | 3 | 1 | 10 | 0.02 |  | Ti | Ni |  |  |
| Invention Example 17 | Bal. | 3 | 1 | 10 | 0.02 |  | Ti | Ni |  |  |
| Invention Example 18 | Bal. | 3 | 1 | 10 | 0.02 |  | Ti | Ni |  |  |
| Invention Example 19 | Bal. | 3 | 1 | 10 | 0.02 |  | Ti | Ni |  |  |
| Invention Example 20 | Bal. | 3 | 1 | 10 | 0.02 |  | Ti | Ni |  |  |
| Invention Example 21 | Bal. | 3 | 1 | 10 | 0.02 |  | Ti | Ni |  |  |
| Invention Example 22 | Bal. | 3 | 1 | 10 | 0.02 |  | Ti | Ni |  |  |
| Invention Example 23 | Bal. | 3 | 1 | 10 | 0.02 |  | Ti | Ni |  |  |
| Invention Example 24 | Bal. | 3 | 1 | 10 | 0.02 |  | Ti | Ni |  |  |

|  | Preheating | | Heating | | | |
|---|---|---|---|---|---|---|
|  | | | Temperature | | Peak | |
|  | Temperature (°C.) | Retention Time (min) | Rise Rate (°C./sec) | Retention Time (min) | Temperature (°C.) | Pressure Reduction Timing of Start |
| Invention Example 1 | 200 | 5 | 2 | 2 | 300 | after reaching 270° C. and elapsing of 1 min |
| Invention Example 2 | 200 | 5 | 2 | 2 | 300 | after reaching 270° C. and elapsing of 1 min |
| Invention Example 3 | 200 | 5 | 2 | 2 | 300 | after reaching 270° C. and elapsing of 1 min |
| Invention Example 4 | 200 | 5 | 2 | 2 | 300 | after reaching 270° C. and elapsing of 1 min |
| Invention Example 5 | 200 | 5 | 2 | 2 | 300 | after reaching 270° C. and elapsing of 1 min |
| Invention Example 6 | 200 | 5 | 2 | 2 | 300 | after reaching 270° C. and elapsing of 1 min |
| Invention Example 7 | 200 | 5 | 2 | 2 | 300 | after reaching 270° C. and elapsing of 1 min |
| Invention Example 8 | 200 | 5 | 2 | 2 | 300 | after reaching 270° C. and elapsing of 1 min |
| Invention Example 9 | 200 | 5 | 2 | 2 | 300 | after reaching 270° C. and elapsing of 1 min |
| Invention Example 10 | 200 | 5 | 2 | 2 | 300 | after reaching 270° C. and elapsing of 1 min |
| Invention Example 11 | 200 | 5 | 2 | 2 | 300 | after reaching 270° C. and elapsing of 1 min |
| Invention Example 12 | 200 | 5 | 2 | 2 | 300 | after reaching 270° C. and elapsing of 1 min |
| Invention Example 13 |  |  | 2 | 2 | 300 | after reaching 270° C. and elapsing of 1 min |
| Invention Example 14 | 200 | 5 | 2 | 2 | 270 | after reaching 270° C. and elapsing of 1 min |

TABLE 1-continued

| | | | | | | |
|---|---|---|---|---|---|---|
| Invention Example 15 | 200 | 5 | 2 | 2 | 330 | after reaching 270° C. and elapsing of 1 min |
| Invention Example 16 | 200 | 5 | 2 | 0.5 | 300 | after reaching 270° C. and elapsing of 1 min |
| Invention Example 17 | 200 | 5 | 2 | 5 | 300 | after reaching 270° C. and elapsing of 1 min |
| Invention Example 18 | 200 | 5 | 2 | 2 | 300 | after reaching 270° C. and elapsing of 20 min |
| Invention Example 19 | 200 | 5 | 2 | 2 | 300 | Just after reaching 225° C. |
| Invention Example 20 | 200 | 5 | 2 | 2 | 300 | after reaching 270° C. + elapsing of 1 min |
| Invention Example 21 | 200 | 5 | 2 | 2 | 300 | after reaching 270° C. + elapsing of 1 min |
| Invention Example 22 | 200 | 5 | 2 | 2 | 300 | after reaching 270° C. + elapsing of 1 min |
| Invention Example 23 | 200 | 5 | 2 | 2 | 300 | after reaching 270° C. + elapsing of 1 min |
| Invention Example 24 | 200 | 5 | 2 | 2 | 300 | after reaching 270° C. + elapsing of 1 min |

| | Pressure Reduction | | | Cooling | | | |
|---|---|---|---|---|---|---|---|
| | Pressure Reduction Time (sec) | Pressure After Venting (atm) | Time from Completion of Venting to Start of Cooling (sec) | Cooling Time from 270° C. to 230° C. (sec) | Remaining of Ni Layer | Penetration of SnSb Phase | Separation, Non-Wetting, Splashing, Chip Breakage |
| Invention Example 1 | 100 | 1 | 10 | 60 | A | none | none |
| Invention Example 2 | 100 | 1 | 10 | 60 | A | none | none |
| Invention Example 3 | 100 | 1 | 10 | 60 | A | none | none |
| Invention Example 4 | 100 | 1 | 10 | 60 | A | none | none |
| Invention Example 5 | 100 | 1 | 10 | 60 | A | none | none |
| Invention Example 6 | 100 | 1 | 10 | 60 | A | none | none |
| Invention Example 7 | 100 | 1 | 10 | 60 | A | none | none |
| Invention Example 8 | 100 | 1 | 10 | 60 | A | none | none |
| Invention Example 9 | 100 | 1 | 10 | 60 | A | none | none |
| Invention Example 10 | 100 | 1 | 10 | 60 | A | none | none |
| Invention Example 11 | 100 | 1 | 10 | 60 | A | none | none |
| Invention Example 12 | 100 | 1 | 10 | 60 | A | none | none |
| Invention Example 13 | 100 | 1 | 10 | 60 | A | none | none |
| Invention Example 14 | 100 | 1 | 10 | 60 | A | none | none |
| Invention Example 15 | 100 | 1 | 10 | 60 | A | none | none |
| Invention Example 16 | 100 | 1 | 10 | 60 | A | none | none |
| Invention Example 17 | 100 | 1 | 10 | 60 | A | none | none |
| Invention Example 18 | 100 | 1 | 10 | 60 | A | none | none |
| Invention Example 19 | 100 | 1 | 10 | 60 | A | none | none |
| Invention Example 20 | 100 | 0.8 | 10 | 60 | A | none | none |
| Invention Example 21 | 30 | 1 | 10 | 60 | A | none | none |

TABLE 1-continued

| | | | | | | | | |
|---|---|---|---|---|---|---|---|---|
| Invention Example 22 | 240 | 1 | 10 | 60 | A | none | none | |
| Invention Example 23 | 100 | 1 | 10 | 5 | A | none | none | |
| Invention Example 24 | 100 | 1 | 10 | 120 | A | none | none | |

| | Alloy Composition (mass %) | | | | | | Back Metal | | | |
|---|---|---|---|---|---|---|---|---|---|---|---|
| | | | | | | | Second Metal Layer | Barrier Layer | First Metal Layer | Third Metal Layer | Fourth Metal Layer |
| | Sn | Ag | Cu | Sb | Ni | Others | | | | | |
| Comparative Example 1 | Bal. | 3 | 1 | 10 | 0.02 | | | Ti | Ni | | |
| Comparative Example 2 | Bal. | 3 | 1 | 10 | 0.02 | | | Ti | Ni | | |
| Comparative Example 3 | Bal. | 3 | 1 | 10 | 0.02 | | | Ti | Ni | | |
| Comparative Example 4 | Bal. | 3 | 1 | 10 | 0.02 | | | Ti | Ni | | |
| Comparative Example 5 | Bal. | 3 | 1 | 10 | 0.02 | | | Ti | Ni | | |
| Comparative Example 6 | Bal. | 3 | 1 | 10 | 0.02 | | | Ti | Ni | | |
| Comparative Example 7 | Bal. | 3 | 1 | 10 | 0.02 | | | Ti | Ni | | |
| Comparative Example 8 | Bal. | 3 | 1 | 10 | 0.02 | | | Ti | Ni | | |
| Comparative Example 9 | Bal. | 3 | 1 | 10 | 0.02 | | | Ti | Ni | | |
| Comparative Example 10 | Bal. | 3 | 1 | 10 | 0.02 | | | Ti | Ni | | |
| Comparative Example 11 | Bal. | 3 | 1 | 10 | 0.02 | | | Ti | Ni | | |
| Comparative Example 12 | Bal. | 3 | 1 | 10 | 0.02 | | | Ti | Ni | | |

| | Preheating | | Heating | | | |
|---|---|---|---|---|---|---|
| | | | Temperature | | Peak | |
| | Temperature (° C.) | Retention Time (min) | Rise Rate (° C./sec) | Retention Time (min) | Temperature (° C.) | Pressure Reduction Timing of Start |
| Comparative Example 1 | 200 | 5 | 2 | <u>10</u> | <u>340</u> | after reaching 270° C. + elapsing of 1 min |
| Comparative Example 2 | 200 | 5 | 2 | 2 | <u>260</u> | after reaching 270° C. + elapsing of 1 min |
| Comparative Example 3 | 200 | 5 | 2 | 2 | <u>340</u> | after reaching 270° C. + elapsing of 1 min |
| Comparative Example 4 | 200 | 5 | 2 | <u>0.1</u> | 300 | after reaching 270° C. + elapsing of 1 min |
| Comparative Example 5 | 200 | 5 | 2 | <u>10</u> | 300 | after reaching 270° C. + elapsing of 1 min |
| Comparative Example 6 | 200 | 5 | 2 | 2 | 300 | <u>just after reaching 266° C.</u> |
| Comparative Example 7 | 200 | 5 | 2 | 2 | 300 | <u>just after reaching 230° C.</u> |
| Comparative Example 8 | 200 | 5 | 2 | 2 | 300 | after reaching 270° C. + elapsing of 1 min |
| Comparative Example 9 | 200 | 5 | 2 | 2 | 300 | after reaching 270° C. + elapsing of 1 min |
| Comparative Example 10 | 200 | 5 | 2 | 2 | 300 | after reaching 270° C. + elapsing of 1 min |
| Comparative Example 11 | 200 | 5 | 2 | 2 | 300 | after reaching 270° C. + elapsing of 1 min |

TABLE 1-continued

| | | | | | | |
|---|---|---|---|---|---|---|
| Comparative Example 12 | 200 | 5 | 2 | 2 | 300 | after reaching 270° C. + elapsing of 1 min |

| | Pressure Reduction | | Cooling | | | |
|---|---|---|---|---|---|---|
| | Pressure Reduction Time (sec) | Pressure After Venting (atm) | Time from Completion of Venting to Start of Cooling (sec) | Cooling Time from 270° C. to 230° C. (sec) | Remaining of Ni Layer | Penetration of SnSb Phase | Separation, Non-Wetting, Splashing, Chip Breakage |

| | Pressure Reduction Time (sec) | Pressure After Venting (atm) | Time from Completion of Venting to Start of Cooling (sec) | Cooling Time from 270° C. to 230° C. (sec) | Remaining of Ni Layer | Penetration of SnSb Phase | Separation, Non-Wetting, Splashing, Chip Breakage |
|---|---|---|---|---|---|---|---|
| Comparative Example 1 | 100 | 1 | 10 | <u>600</u> | C | present | present |
| Comparative Example 2 | 100 | 1 | 10 | 60 | A | none | present |
| Comparative Example 3 | 100 | 1 | 10 | 60 | C | none | present |
| Comparative Example 4 | 100 | 1 | 10 | 60 | A | none | present |
| Comparative Example 5 | 100 | 1 | 10 | 60 | C | none | present |
| Comparative Example 6 | 100 | 1 | 10 | 60 | A | none | present |
| Comparative Example 7 | 100 | 1 | 10 | 60 | A | none | present |
| Comparative Example 8 | <u>10</u> | 1 | 10 | 60 | A | none | present |
| Comparative Example 9 | <u>300</u> | 1 | 10 | 60 | C | none | present |
| Comparative Example 10 | 100 | <u>0.1</u> | 10 | 60 | A | none | present |
| Comparative Example 11 | 100 | 1 | 10 | <u>1</u> | A | none | present |
| Comparative Example 12 | 100 | 1 | 10 | <u>180</u> | A | present | present |

The underline indicates that the value is out of the scope of the present invention.

As seen from Table 1, in Invention Examples, the Ni layer remained, the SnSb phase did not penetrate, and all of separation of the back metal from the solder layer, non-wetting, splashing and chip cracking were not observed.

On the other hand, in Comparative Example 1 where the heating time is long and the peak temperature during heating is high, the Ni layer disappeared, and separation occurred. In addition, since the cooling time is long, the SnSb phase penetrated the solder alloy layer. Therefore, separation between the back metal and the back metal-side intermetallic compound layer was observed.

In Comparative Example 2 where the peak temperature during heating is low, non-wetting was assumed.

In Comparative Example 3 where the peak temperature is high, the Ni layer disappeared, and separation was observed.

In Comparative Example 4 where the retention time during heating is short, non-wetting occurred.

In Comparative Example 5 where the retention time during heating is long, non-wetting was assumed.

In Comparative Example 6 where pressure reduction is started at 266° C. before the heating temperature reaches 270° C., the wetting was insufficient.

In Comparative Example 7 where pressure reduction is started at 230° C. after the heating temperature has reached 227° C., the solder was splashed.

In Comparative Example 8 where the pressure reduction time is short, non-wetting was assumed.

In Comparative Example 9 where the pressure reduction time is too long, the Ni layer disappeared, and separation occurred.

In Comparative Example 10 where the pressure after venting is low, non-wetting was assumed.

In Comparative Example 11 where the cooling time is short, the solidification shrinkage was large due to rapid cooling, and Si chip breakage occurred.

In Comparative Example 12 where the cooling time is long, the SnSb phase penetrated the solder alloy layer, and separation occurred.

Figure 4B:
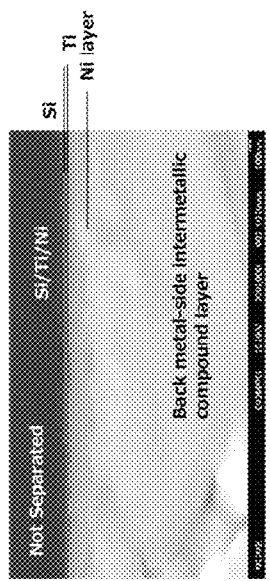
FIG. 4A and FIG. 4B are SEM photographs of Invention Example 1.
Figure 4D:
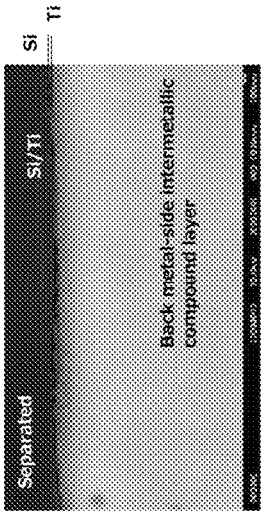
FIG. 4C and FIG. 4D are SEM photographs of Comparative Example 1.
Figure 4A:
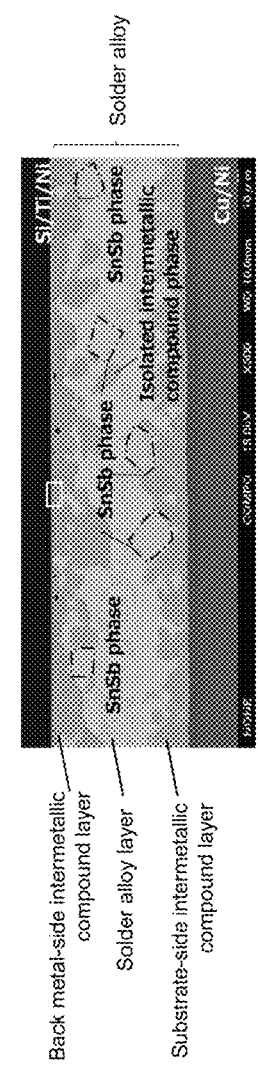
Figure 4C:
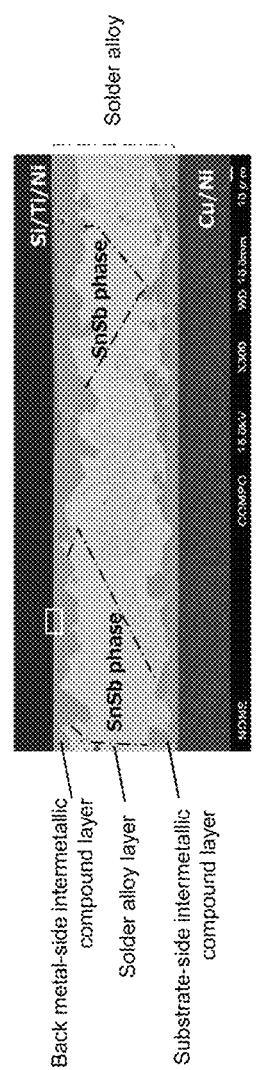

In order to verify these, FIGS. 4A-4D illustrate cross-sectional SEM photographs. FIGS. 4A-4D illustrate cross-sectional SEM photographs of Invention Example 1 and Comparative Example 1; FIG. 4A and FIG. 4B are an SEM photograph of Invention Example 1, and FIG. 4C and FIG. 4D are an SEM photograph of Comparative Example 1. FIG. 4B and FIG. 4D are photographs enlarging the white square portion of FIG. 4A and FIG. 4C, respectively. In addition, in FIG. 4A, the region surrounded by an alternate long and short dash line indicates the SnSb phase. In FIG. 4C, the region surrounded by an alternate long and short dash line, a back metal-side intermetallic compound phase, and a substrate-side intermetallic compound phase indicates the SnSb phase.

As apparent from FIG. 4A and FIG. 4B, in the solder joint of Invention Example 1, the SnSb phase is in contact only with either one intermetallic compound layer, the Ni layer of the back metal remains, and separation of the back metal from the back metal-side intermetallic compound layer is not observed. On the other hand, in FIG. 4C and FIG. 4D, an Sn—Sb phase penetrating the solder alloy layer is present and not only the Ni layer of the back metal disappears but also separation of the back metal from the intermetallic compound layer is observed. In FIG. 4A, despite, an isolated intermetallic compound phase, which has the same composition as the back metal-side intermetallic compound layer, liberated from a series of back metal-side intermetallic compound layers formed at the interface between the back metal and the solder alloy is observed. This isolated intermetallic compound phase is not regarded as the back metal-side intermetallic compound layer.

The average distance between the back metal of the electronic component and the lead frame substrate of above-described Invention Examples and Comparative Examples was determined by measuring, at each of four corners of the electronic component, the height from the top surface of the substrate to the top surface of the electronic component by means of a confocal microscope, and calculating a difference between the weighted average of each height and the height of the electronic component including the back metal.

The average distance between the lead frame and the back metal was about 90 μm in both Invention Example 1 and Comparative Example 1. The Feret diameter of the SnSb phase of Comparative Examples was 82 μm at the maximum. The Feret diameter of the SnSb phase of Invention Examples was 30 μm at the maximum and found to be smaller than the average of distances of the lead frame and the silicon chip. In addition, while the Feret diameter of Invention Examples was 33.3% or less of the average distance between the lead frame and the back metal, the Feret diameter of Comparative Examples was 91% or more of the average distance between the lead frame and the back metal.

Furthermore, the shortest distance between the back metal-side intermetallic compound layer and the substrate-side intermetallic compound layer observed in FIG. 4A was about 25 μm. This reveals that in the solder joint of Invention Example 1, the shortest distance between both intermetallic compound layers is smaller than the Feret diameter. It is also revealed that even in such a circumstance, as long as the SnSb phase does not penetrate the solder alloy layer, the effects are exerted.

REFERENCE SIGNS LIST 11, 21, 31, 41, 51, 61, 71, 81: Electronic component (silicon chip)
12, 22, 32, 42, 52, 62, 72, 82: Substrate
13, 23, 33, 43, 53, 63, 73, 83: Solder alloy
14, 24, 34, 44, 54, 64, 74, 84: Barrier layer
15, 25, 35, 45, 55, 65, 75, 85: First metal layer
26, 36, 46, 66, 86: Second metal layer
37, 47, 77, 87: Third metal layer
48, 88: Fourth metal layer
19, 29, 39, 49, 59, 69, 79, 89: Back metal

The invention claimed is:

1. A solder joint in which an electronic component with a back metal is bonded to a substrate by a solder alloy, wherein the solder alloy comprises:
   a solder alloy layer having an alloy composition consisting of, in mass %: Ag: 2 to 4%, Cu: 0.6 to 2%, Sb: 9.0 to 12%, Ni: 0.005 to 1%, optionally Co: 0.2% or less and Fe: 0.1% or less, with the balance being Sn;
   an Sn—Sb intermetallic compound phase;
   a back metal-side intermetallic compound layer formed at an interface between the back metal and the solder alloy; and
   a substrate-side intermetallic compound layer formed at an interface between the substrate and the solder alloy, and
   wherein the solder alloy layer exists at least one of between the Sn—Sb intermetallic compound phase and the back metal-side intermetallic compound layer, and between the Sn—Sb intermetallic compound phase and the substrate-side intermetallic compound layer.

2. The solder joint according to claim 1, wherein as for the Sn—Sb intermetallic compound phase, in a cross-section of the solder joint, a Feret diameter of the Sn—Sb intermetallic compound phase, which is a distance between two parallel lines that are parallel to the substrate and sandwich the Sn—Sb intermetallic compound phase, is 60% or less of an average distance between the back metal of the electronic component and the substrate.

3. The solder joint according to claim 1, wherein the alloy composition consists of, in mass %, Ag: 2 to 4%, Cu: 0.6 to 2%, Sb: 9.0 to 12%, Ni: 0.005 to 1%, and at least one of Co: 0.2% or less and Fe: 0.1% or less, with the balance being Sn.

4. The solder joint according to claim 1, wherein an average of distances between the back metal and the substrate is from 50 μm to 400 μm.

5. The solder joint according to claim 1, wherein the back metal comprises, in order from the electronic component side, a barrier layer containing at least one of Ti, Cr and V as a main component and a first metal layer containing at least one of Ni and Cu as a main component.

6. The solder joint according to claim 5, comprising, between the electronic component and the barrier layer, a second metal layer containing at least one of Au and Al as a main component.

7. The solder joint according to claim 5, comprising, between the first metal layer and the solder alloy, a third metal layer containing at least one of Au, Ag, Sn, Ni and Cu as a main component.

8. The solder joint according to claim 7, comprising, between the third metal layer and the solder alloy, a fourth metal layer containing at least one of Au, Ag, Ni and Sn as a main component.

9. A method for forming the solder joint according to claim 1 in which an electronic component with a back metal is bonded to a substrate by a solder alloy, the method comprising:
   a heating step of heating a substrate above which an electronic component has been placed via a solder alloy at a temperature in a heating temperature region being at least 10° C. higher than a liquidus temperature of the solder alloy, such that a retention time in the heating temperature region is from 30 seconds to 5 minutes and a peak temperature in the retention time is from 270 to 330° C.;
   a pressure reduction step of reducing a pressure of a heating atmosphere to 100 Pa or less before a heating temperature of the substrate reaches 227° C. or reducing the pressure of the heating atmosphere to 100 Pa or less by starting pressure reduction at least 20 seconds after the heating temperature of the substrate reaches the heating temperature region, wherein a pressure reduction time which is a time until the heating atmosphere is returned to a pressure region of at least 0.8 atm from the start of pressure reduction is from 30 seconds to 4 minutes; and
   a cooling step of, after the heating step, cooling a temperature region of from precipitation start temperature of the Sn—Sb intermetallic compound phase to 230° C. for 5 seconds or more and 2 minutes or less.

10. The method for forming the solder joint according to claim 9, wherein the heating step includes a preheating step of heating the substrate in a temperature region of from 150 to 220° C. for 2 to 10 minutes before the heating temperature of the substrate reaches 227° C.

11. The method for forming the solder joint according to claim 9, wherein in the pressure reduction step, the heating atmosphere is returned to a pressure of at least 0.8 atm 5 seconds to 2 minutes before a start of the cooling step.

12. The method for forming the solder joint according to claim 1, wherein the pressure reduction step is started after a lapse of from 20 seconds to 3 minutes after the heating temperature of the substrate reaches the heating temperature region.

13. The method for forming the solder joint according to claim 1, wherein the pressure reduction step is performed a plurality of time within the pressure reduction time.

* * * * *